(12) United States Patent
Kurokawa et al.

(10) Patent No.: US 9,240,314 B2
(45) Date of Patent: Jan. 19, 2016

(54) SUBSTRATE TREATMENT DEVICE AND SUBSTRATE TREATMENT METHOD

(75) Inventors: Yoshiaki Kurokawa, Yokohama (JP);
Koichi Hamada, Yokohama (JP); Nobuo Kobayashi, Yokohama (JP); Yuji Nagashima, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 157 days.

(21) Appl. No.: 13/574,328

(22) PCT Filed: Jan. 20, 2011

(86) PCT No.: PCT/JP2011/051019
§ 371 (c)(1),
(2), (4) Date: Oct. 3, 2012

(87) PCT Pub. No.: WO2011/090141
PCT Pub. Date: Jul. 28, 2011

(65) Prior Publication Data
US 2013/0025636 A1 Jan. 31, 2013

(30) Foreign Application Priority Data
Jan. 22, 2010 (JP) ................................. 2010-012634

(51) Int. Cl.
*B08B 3/00* (2006.01)
*H01L 21/02* (2006.01)
(Continued)

(52) U.S. Cl.
CPC .......... *H01L 21/02052* (2013.01); *G03F 7/423* (2013.01); *H01L 21/67028* (2013.01); *H01L 21/67051* (2013.01); *H01L 21/67109* (2013.01)

(58) Field of Classification Search
CPC ................... H01L 21/67051; H01L 21/6715; H01L 21/67109; H01J 37/3244; C23C 16/45565
USPC ............. 134/33, 157, 105, 137, 902, 1.2, 1.3; 427/248.1, 240, 255.5, 372.2; 118/715, 118/730, 500, 52, 725, 728
See application file for complete search history.

(56) References Cited

U.S. PATENT DOCUMENTS 6,190,063 B1    2/2001   Akimoto ....................... 396/611

FOREIGN PATENT DOCUMENTS

JP    61104621    5/1986
JP    10135127    5/1998
(Continued)

OTHER PUBLICATIONS

Matsuo, "Substrate Developing Apparatus", May 1998, JP 10-135127 (Machine Translation).*
(Continued)

*Primary Examiner* — Michael Barr
*Assistant Examiner* — Thomas Bucci
(74) *Attorney, Agent, or Firm* — Kratz, Quintos & Hanson, LLP

(57) ABSTRACT

[Problem] To provide a substrate treatment device which can more efficiently heat and more efficiently use a treatment solution to treat the surface of a plate-shaped substrate.
[Solution] A substrate treatment device which is provided with a treatment solution feed mechanism 50 and feeds a treatment solution S to the surface of a plate-shaped substrate that is held on the substrate holding part 10 and which uses the treatment solution S to treat the surface of the plate-shaped substrate 100, which substrate treatment device has a treatment solution holding plate 15 which is arranged facing the surface of the plate-shaped substrate 100 that is held at the substrate holding part 10, across a predetermined distance, and which holds the treatment solution with the surface of the plate-shaped substrate 100 and a heating part 30 which contacts a predetermined region of the treatment solution holding plate 15, including a position corresponding to the axis of rotation of the substrate holding part 10, to heat the predetermined region and which treatment solution feed mechanism feeds the treatment solution S to the clearance between the surface of the plate-shaped substrate 100 which rotates together with the substrate holding part 10 and the treatment solution holding plate 15 which is heated by the heating part 20.

18 Claims, 18 Drawing Sheets

(51) Int. Cl.
*H01L 21/67* (2006.01)
*G03F 7/42* (2006.01)

(56) References Cited

FOREIGN PATENT DOCUMENTS

| JP | 11260718 | 9/1999 |
|---|---|---|
| JP | 2002-110525 | 4/2002 |
| JP | 2008-066400 | 3/2008 |

OTHER PUBLICATIONS

Kobayashi, "Positive Photoresist-Developing Apparatus", May 1986, JP 61-104621 (Machine Translation).*
Akimoto et al., "Method and Apparatus for Development", Sep. 1999, JP 11-260718 (Machine Translation).*
Office Action dated Jul. 1, 2014 corresponding to Chinese Application No. 201180006698.2 with English translation.

* cited by examiner ated substrate treatment device, it has been desired to more efficiently heat and more efficiently utilize the treatment solution to treat the surface of the plate-shaped substrate.

SUBSTRATE TREATMENT DEVICE AND SUBSTRATE TREATMENT METHOD

TECHNICAL FIELD

The present invention relates to a substrate treatment device and substrate treatment method which treat the surface of a semiconductor wafer or other plate-shaped substrate by a treatment solution.

BACKGROUND ART

In the past, a substrate treatment device has been provided which removes the resist which is formed on the surface of a semiconductor wafer by a treatment solution which is comprised of, for example, a mixture of sulfuric acid and hydrogen peroxide (see Patent literature 1). In this substrate treatment device, a heater is embedded in a holding plate. The surface of the semiconductor wafer which is held on the holding plate is sprayed with a treatment solution. Since the surface of the thus heated semiconductor wafer is fed with a treatment solution, the treatment solution is heated through the semiconductor wafer and is raised in the resist removal ability. As a result, it is possible to reliably remove the resist from the surface of the semiconductor wafer.

CITATIONS LIST

Patent Literature

Patent Literature 1: Japanese Patent Publication No. 2008-66400 A1

SUMMARY OF INVENTION

Technical Problem

However, in the above-mentioned conventional substrate treatment device, the heated semiconductor wafer is simply sprayed with the treatment solution, so the efficiency of heating of the treatment solution is poor and, further, the efficiency of utilization of the treatment solution is also poor.

The present invention was made in consideration of this situation and provides a substrate treatment device and substrate treatment method which can more efficiently heat and efficiently use the treatment solution to treat the surface of the plate-shaped substrate.

Solution to Problem

The substrate treatment device according to the present invention is a substrate treatment device which is provided with a treatment solution feed mechanism that feeds a treatment solution to a surface of a plate-shaped substrate that is held on a substrate holding part which is rotated about a predetermined axis of rotation and which uses the treatment solution to treat the surface of said plate-shaped substrate, the substrate treatment device comprising: a treatment solution holding plate which is arranged facing the surface of the plate-shaped substrate that is held on the substrate holding part, across a predetermined distance, so as to hold the treatment solution between the surface of said plate-shaped substrate and it; and a heating part which is in contact with a predetermined region of the treatment solution holding plate, including a position corresponding to the axis of rotation of the substrate holding part, to heat the predetermined region, wherein the treatment solution feed mechanism feeds the treatment solution to a clearance between the surface of the plate-shaped substrate which rotates together with the substrate holding part and the treatment solution holding plate which is heated by the heating part.

The substrate treatment method according to the present invention is a substrate treatment method using the above-mentioned substrate treatment device, the substrate treatment method comprising: a treatment solution feeding step which feeds the treatment solution from the treatment solution feed mechanism to the clearance between the surface of the plate-shaped substrate which rotates together with the substrate holding plate and the treatment solution holding plate, and a treatment solution holding step which holds the treatment solution at the clearance between the surface of the plate-shaped substrate and the treatment solution holding plate which is heated by said heating part.

Advantageous Effects of Invention

According to the substrate treatment device and substrate treatment method of the present invention, the treatment solution which is heated by the treatment solution holding plate that is heated by the heating part is maintained in a layer state between the treatment solution holding plate and the rotating plate-shaped substrate and the surface of the plate-shaped substrate is treated by the treatment solution which is heated and held in a layer state, so the treatment solution is efficiently used without waste to treat the surface of the plate-shaped substrate. Further, the heating part is in contact with a predetermined region of the treatment solution holding plate which includes a position which corresponds to the axis of rotation of the holding part, so it is possible to make the temperature of the treatment solution which is held between the treatment solution holding plate and the surface of the plate-shaped substrate uniform between the center part near the axis of rotation and the other parts.

DESCRIPTION OF EMBODIMENT

Below, embodiments of the present invention will be explained using the drawings.

Figure 1:
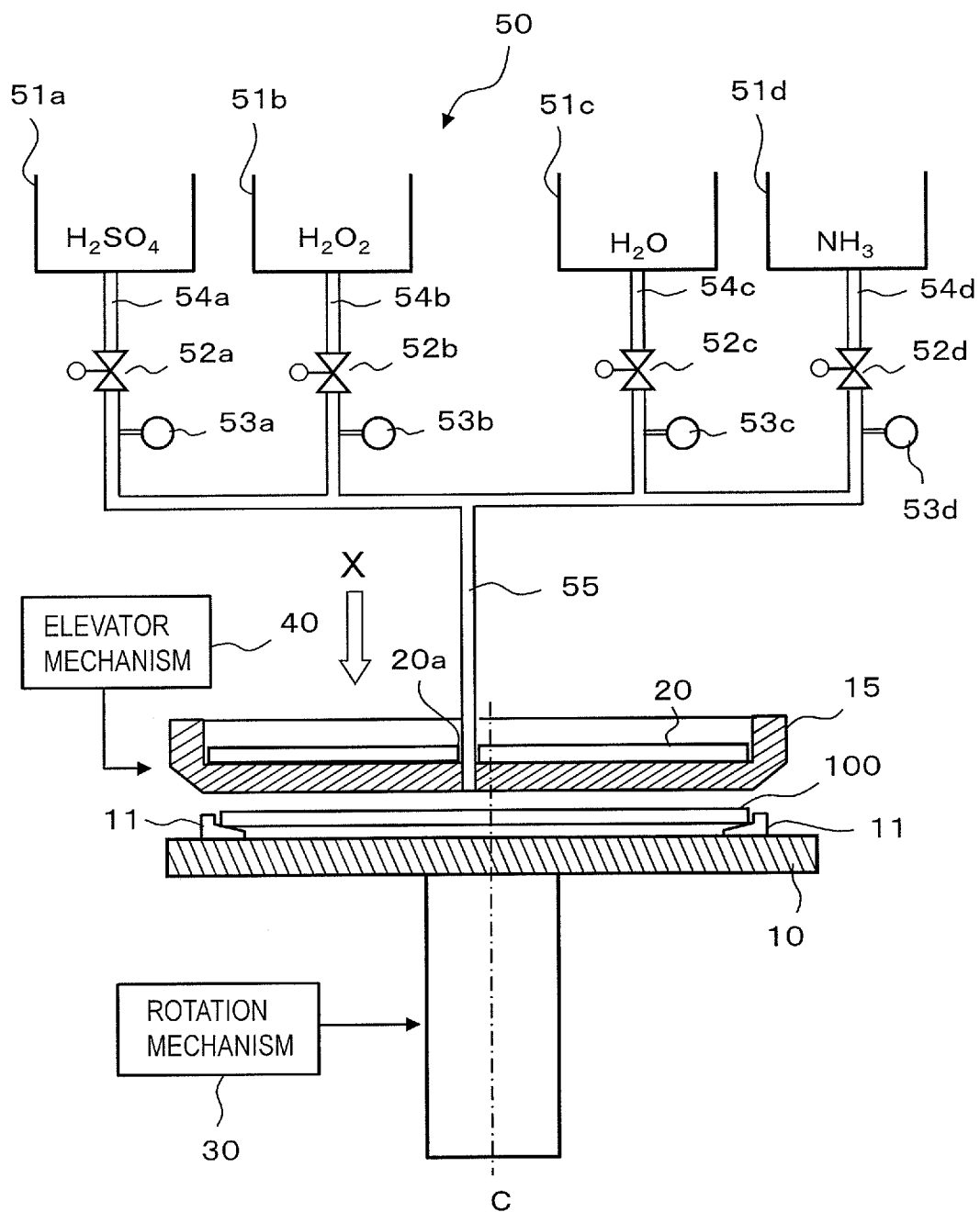
FIG. 1 is a view which shows the configuration of a substrate treatment device according to a first embodiment of the present invention.

The substrate treatment device according to the first embodiment of the present invention is configured as shown in FIG. 1. This substrate treatment device performs treatment to remove the resist which is formed on surface of a semiconductor wafer used as a plate-shaped substrate (hereinafter, simply referred to as a "wafer").

Figure 2:
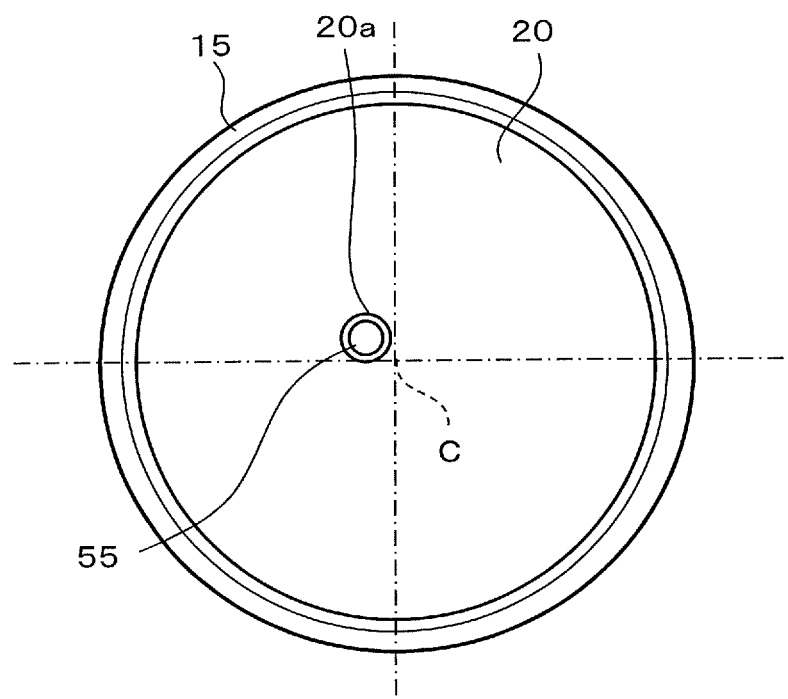
FIG. 2 is a plan view which shows the structure seen from the direction which is shown by the arrow X of FIG. 1 of the substrate holding plate which is used for the substrate treatment device which is shown in FIG. 1.

In FIG. 1, this substrate treatment device has a substrate holding plate 10 (substrate holding part) which holds an object to be treated, that is, a wafer 100, and a treatment solution holding plate 15 which is arranged facing this substrate holding plate 10. The substrate holding plate 10 is structured to be able to rotate about an axis of rotation C by a rotation mechanism 30. At the surface of the substrate holding plate 10, a plurality of support pins 11 are provided. The wafer 100 is held at the substrate holding plate 10 so that the peripheral parts are held by these plurality of support pins 11. Further, the treatment solution holding plate 15 is structured to be able to be raised and lowered by an elevator mechanism 40. The treatment solution holding plate 15 is formed by a material which has resistance to the treatment solution explained later (for example, quartz material). As shown by FIG. 1 and FIG. 2 (showing structure of substrate holding plate 10 seen from direction which is shown by arrow X of FIG. 1), this is shaped as a circular bowl which is formed with walls which rise up at the peripheral parts at the opposite side to the substrate holding plate 10. The surface of the treatment solution holding plate 15 at the opposite side to the surface which faces the substrate holding plate 10 has a circular sheet-shaped heater 20 (heating part) adhered to it. The circular sheet-shaped heater 20 is formed with a circular hole 20a for passing the later explained treatment solution feed pipe 55. This circular hole 20a has a center which is offset from the axis of rotation C of the substrate holding plate 10.

Further, this substrate treatment device has a treatment solution feed mechanism 50. The treatment solution feed mechanism 50 has four treatment solution tanks 51a, 51b, 51c, and 51d which store the treatment solution. The treatment solution tank 51a stores sulfuric acid ($H_2SO_4$), the treatment solution tank 51b stores hydrogen peroxide ($H_2O_2$), the treatment solution tank 51c stores pure water ($H_2O$), and the treatment solution tank 51d stores ammonia ($NH_3$). From the treatment solution tanks 51a, 51b, 51c, 51c, individual tubes 54a, 54b, 54c, and 54d extend. These individual tubes 54a, 54b, 54c, and 54d are joined in parallel to a treatment solution feed pipe 55. The treatment solution feed pipe 55 passes through the hole 20a of the heater 20 to the hole which is formed at a position of the treatment solution holding plate 15 which faces the hole 20a. The front end is exposed from the surface side facing the substrate holding plate 10 (see FIG. 1 and FIG. 2). Due to this, the treatment solution which passes through the treatment solution feed pipe 55 is fed to the surface of the wafer 100.

The individual tubes 54a, 54b, 54c, and 54d are provided with flow regulators 52a, 52b, 52c, and 52d and flowmeters 53a, 53b, 53c, and 53d. By adjusting the flow regulators 52a, 52b, 52c, and 52d, it is possible to adjust the amounts of treatment solution which flow from the corresponding treatment solution tanks 51a, 51b, 51c, and 51d to the treatment solution feed pipe 55. Further, the amounts of the treatment solutions which flow through the individual tubes 54a, 54b, 54c, and 54d at this time are expressed by the corresponding flowmeters 53a, 53b, 53c, and 53d.

Note that, while not shown, the substrate treatment device of the above-mentioned configuration has a rotation mechanism 30, elevator mechanism 40, flow regulators 52a, 52b, 52c, and 52d, and a control device which controls the operation of the heater 20.

In this substrate treatment device, the wafer 100 is treated in the following way.

Figure 3A:
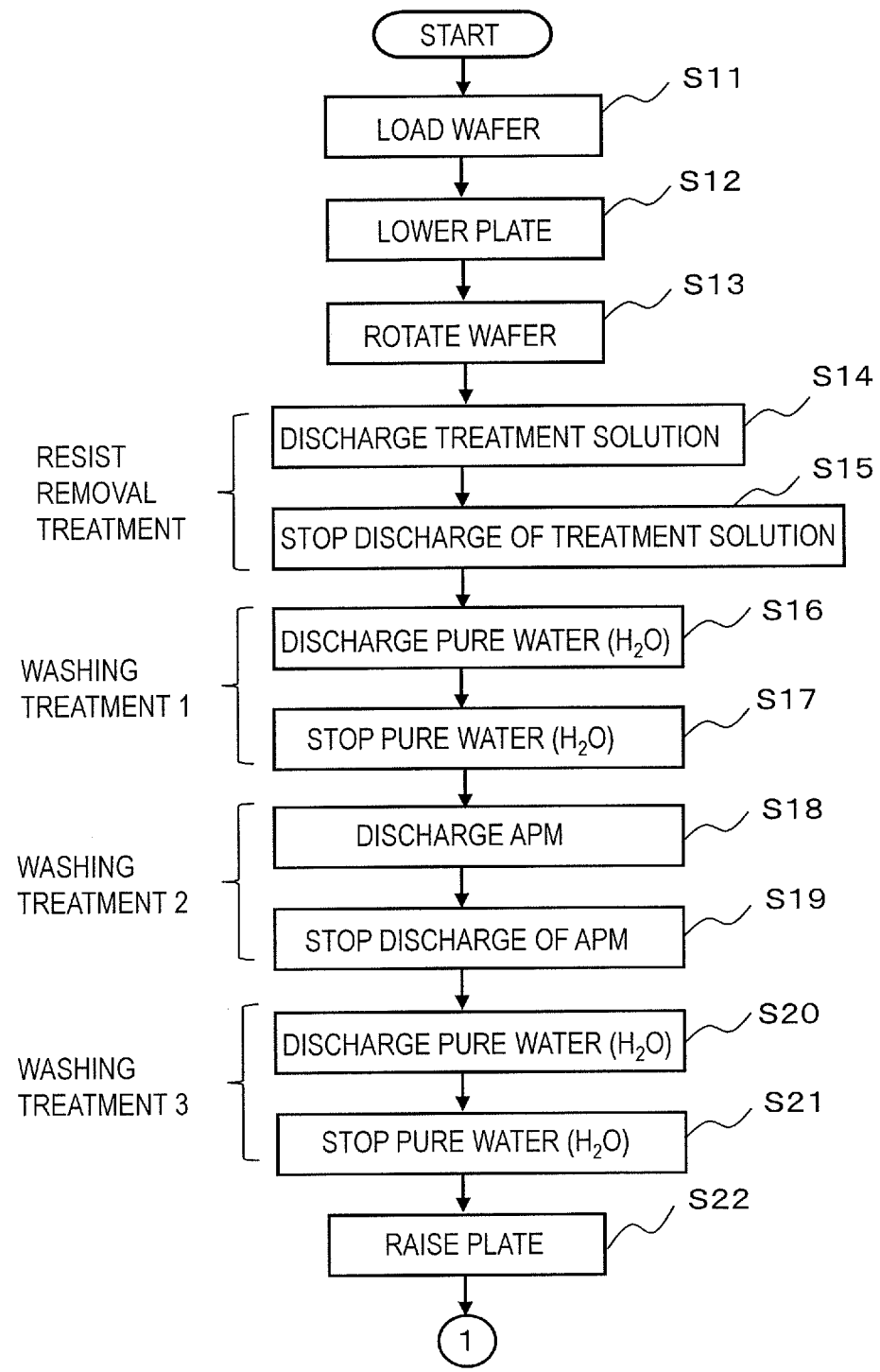
FIG. 3A is a flow chart which shows the operational routine of the substrate treatment device which is shown in FIG. 1 (part 1).
Figure 3B:
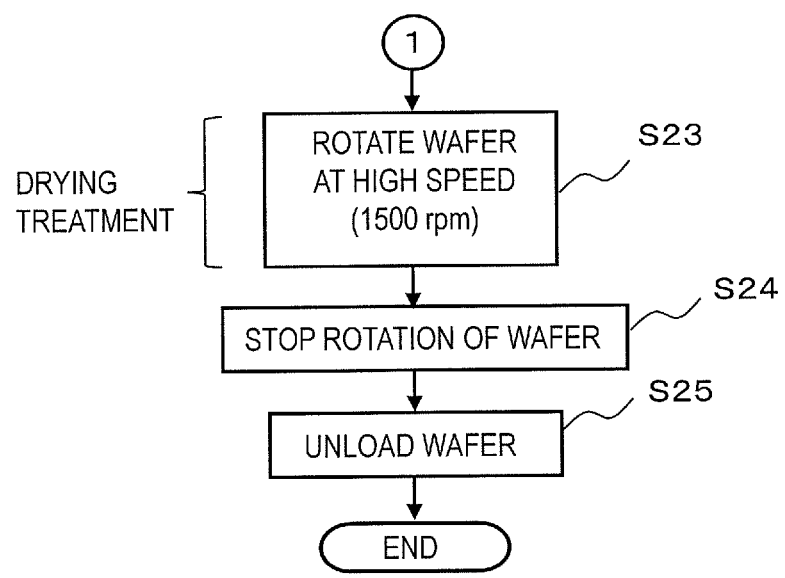
FIG. 3B is a flow chart which shows the operational routine of the substrate treatment device which is shown in FIG. 1 (part 2).

The circular sheet-shaped heater 20 is electrified. This electrified heater 20 is used to uniformly heat the surface at the opposite side from the surface of the treatment solution holding plate 15 which faces the substrate holding plate 10. The treatment solution holding plate 15 as a whole is held at a predetermined temperature (for example, temperature in temperature range of 100° C. to 400° C.). In this state, an operation is performed in accordance with the procedure which is shown in FIG. 3A and FIG. 3B.

Figure 4:
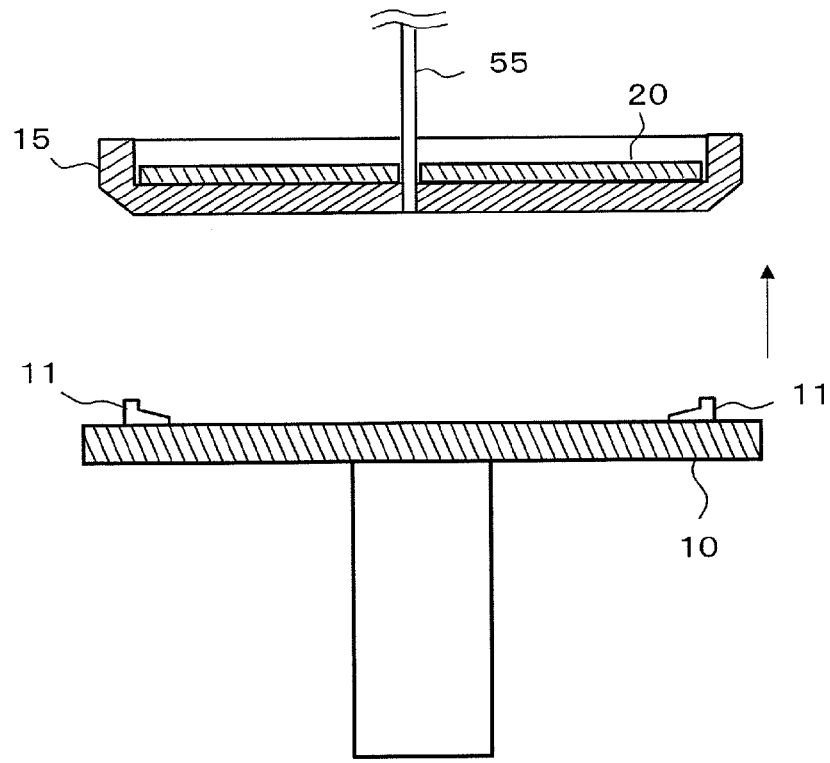
FIG. 4 is a view which shows an ascending operation of the treatment solution holding plate in the substrate treatment device which is shown in FIG. 1.
Figure 5:
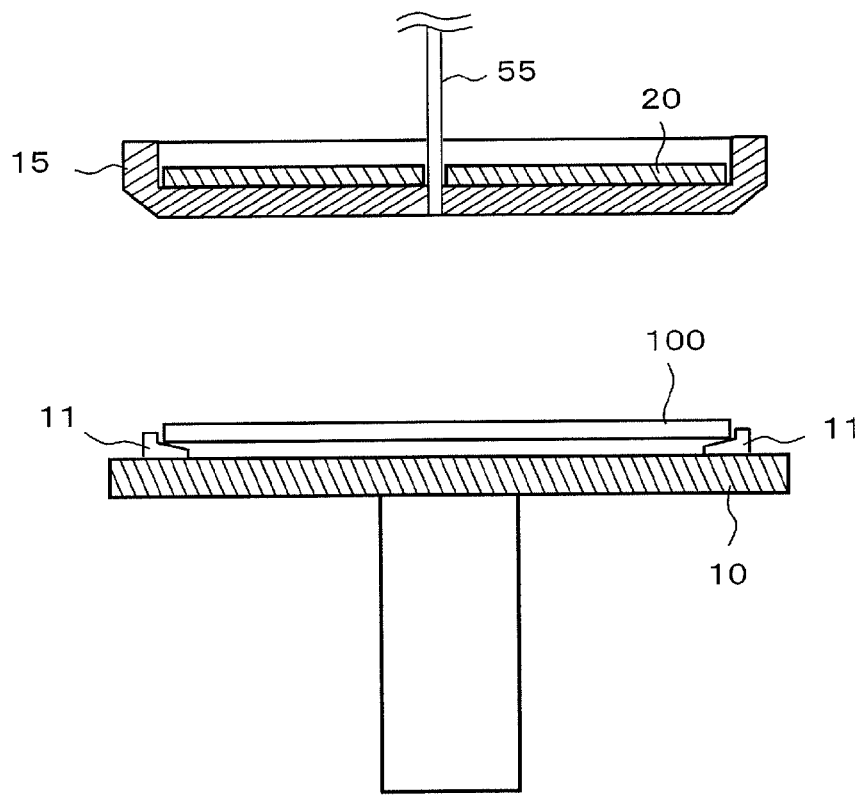
FIG. 5 is a view which shows the loading of a semiconductor wafer in the substrate treatment device which is shown in FIG. 1.

As shown in FIG. 4, the treatment solution holding plate 15 is raised up to the highest point. The wafer 100 under treatment which is loaded between this treatment solution holding plate 15 and the substrate holding plate 10, as shown in FIG. 5, is held on the substrate holding plate 10 by the peripheral part being supported by the plurality of support pins 11 (S11). At this time, it is positioned so that the center of the wafer 100 and the axis of rotation C of the substrate holding plate 10 coincide.

Figure 6:
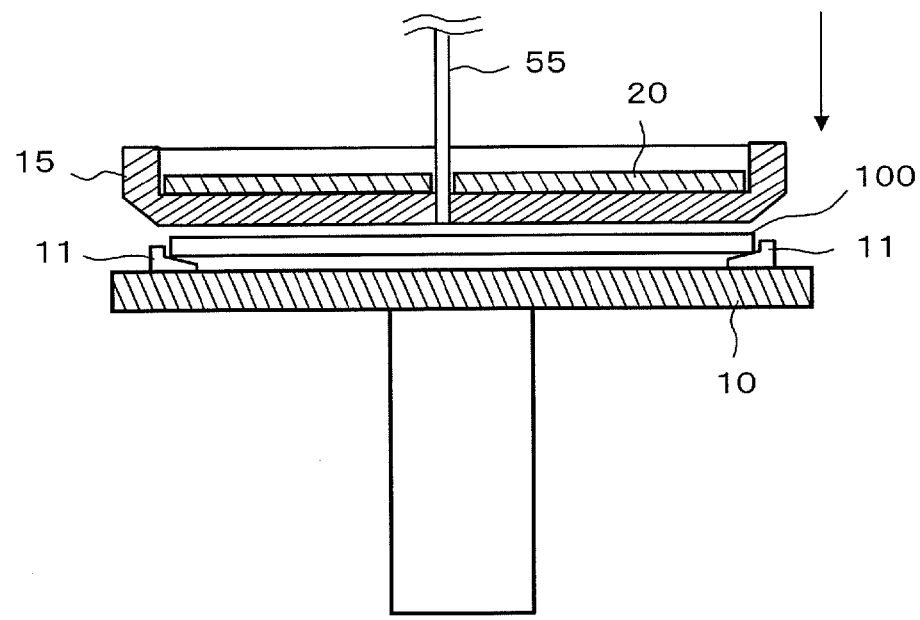
FIG. 6 is a view which shows a descending operation of the treatment solution holding plate in the substrate treatment device which is shown in FIG. 1.
Figure 7:
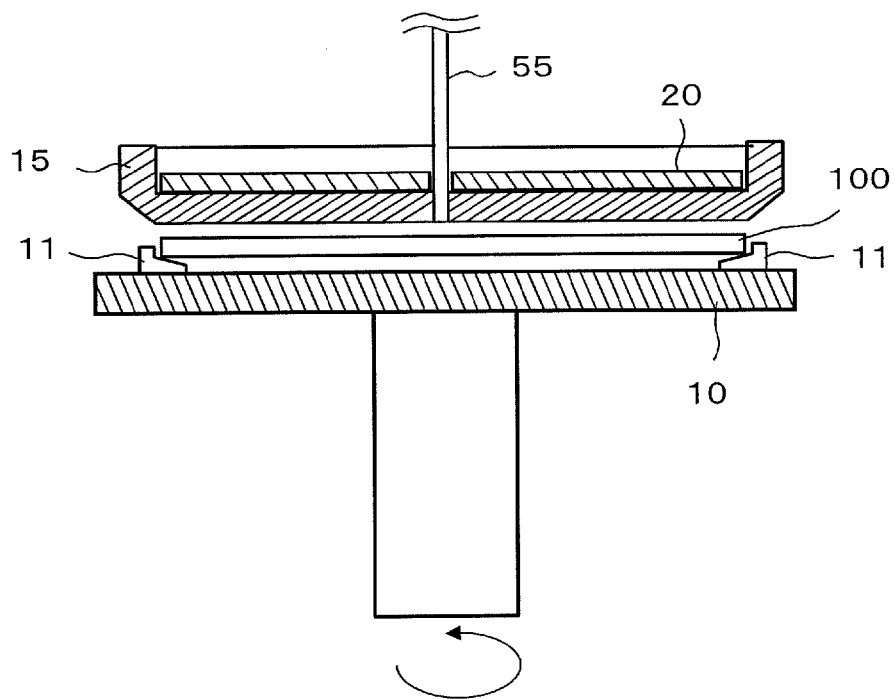
FIG. 7 is a view which shows the rotation operation of a substrate holding plate in the substrate treatment device which is shown in FIG. 1.

Next, the treatment solution holding plate 15, as shown in FIG. 6, descends to a position where a predetermined clearance (for example, 4 mm or less) is formed with the surface of the wafer 100 which is held on the substrate holding plate 10 (S12). Further, as shown in FIG. 7, the substrate holding plate 10 is rotated by a predetermined speed of a relatively low rate (for example, 50 rpm or so). Due to this, the wafer 100 is rotated together with the substrate holding plate 10 at the predetermined speed (S13).

The treatment solution holding plate 15 is arranged facing the surface of the wafer 100 at a predetermined distance. In the state with the wafer 100 rotating by a predetermined speed of a relatively low speed, the treatment solution is fed from the treatment solution feed pipe 55 to the clearance between the treatment solution holding plate 15 and the surface of the wafer 100 (S14). Specifically, in the state where the flow regulators 52c, 52d are closed, the flow regulators 52a, 52b are adjusted in opening degree, the sulfuric acid ($H_2SO_4$) from the treatment solution tank 51a runs through the individual tube 54a by a flow rate in accordance with the opening degree of the flow regulator 52a, while the hydrogen peroxide solution ($H_2O_2$) from the treatment solution tank 51b passes through the individual tube 54b by a flow rate corresponding to the opening degree of the flow regulator 52b and flows into the treatment solution feed pipe 55. Due to this, the treatment solution S which is obtained by mixing of the sulfuric acid ($H_2SO_4$) and hydrogen peroxide solution ($H_2O_2$) passes through the treatment solution feed pipe 55 and is fed to the clearance between the treatment solution holding plate 15 and the surface of the wafer 100.

Figure 8:
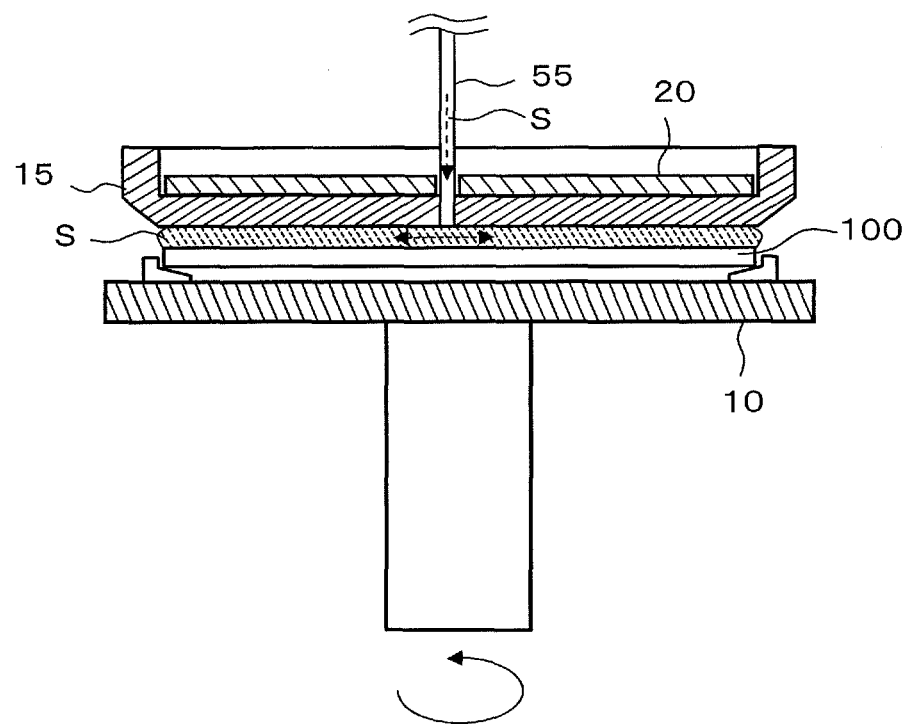
FIG. 8 is a view which shows a feed operation of a treatment solution in the substrate treatment device which is shown in FIG. 1.

If the rotating surface of the wafer 100 is fed with the treatment solution S, the treatment solution S successively moves toward the peripheral direction of the wafer 100. Further, as shown in FIG. 8, the clearance between the treatment solution holding plate 15 and the surface of the wafer 100 is filled with the treatment solution S. The surface tension of the treatment solution S is used to hold the layer state treatment solution S at the surface of the wafer 100. In this way, the treatment solution S which is held in a layer state between the treatment solution holding plate 15 and the surface of the wafer 100 is heated overall by the treatment solution holding plate 15 which is heated by the heater 20 and is thereby maintained at a high temperature (for example, temperature in temperature range of 100° C. to 400° C.) Further, this treatment solution S which is maintained at the high temperature to be raised in resist removing ability (formed by mixing sulfuric acid ($H_2SO_4$) and hydrogen peroxide solution ($H_2O_2$)) removes the resist which is formed on the surface of the wafer 100. In this state, if the treatment solution S is continuously fed from the treatment solution feed pipe 55, the treatment solution S of the surface of the wafer 100 is replaced with the new treatment solution S while the layer shape is maintained and the treatment solution S in which the resist is dissolved is successively discharged as waste liquor from the peripheral parts of the rotating wafer 10 (illustration of discharge mechanism of treatment solution omitted).

Returning to FIG. 3A, when, in the above way, the treatment solution S is fed while the surface of the wafer 100 is treated (resist is removed). When a predetermined treatment time passes, the flow regulators 52a, 52b are closed and the feed of the sulfuric acid ($H_2SO_4$) from the treatment solution tank 51a and feed of the hydrogen peroxide solution ($H_2O_2$) from the treatment solution tank 51b are stopped (S15). After this, the opening degree of the flow regulator 52c is adjusted and pure water ($H_2O$) from the treatment solution tank 51c runs through the individual tube 54c by a flow rate which corresponds to the opening degree of the flow regulator 52c to thereby flow into the treatment solution feed pipe 55 (S16). Due to this, instead of the treatment solution S, the pure water ($H_2O$) is continuously fed from the treatment solution feed pipe 55 to the surface of the wafer 100 whereby the surface of the wafer 100 is washed by the fed pure water ($H_2O$) (washing treatment 1). Further, after the surface of the wafer 100 is washed by the pure water ($H_2O$) for a predetermined time, the flow regulator 51c is closed (S17) and the washing of the surface of the wafer 100 by the pure water ($H_2O$) is ended.

Next, the flow regulators 52b, 52c, and 52d are adjusted in opening degree whereby the hydrogen peroxide ($H_2O_2$) from the treatment solution tank 51b runs through the individual tube 54b in accordance with the opening degree of the flow regulator 52b, the pure water ($H_2O$) from the treatment solution tank 51c runs through the individual tube 54c in accordance with the opening degree of the flow regulator 52c, and the ammonia ($NH_3$) from the treatment solution tank 51d runs through the individual tube 54d in accordance with the opening degree of the flow regulator 52d and thereby flow to the treatment solution feed pipe 55. Due to this, an alkali treatment solution APM which is comprised of a mixture of hydrogen peroxide ($H_2O_2$), pure water ($H_2O$), and ammonia ($NH_3$) runs through the treatment solution feed pipe 55 and is fed to the clearance between the treatment solution holding plate 15 and the surface of the wafer 100 (S18). The fed treatment solution APM neutralizes the acidic residue of the surface of the wafer 100, and the surface of the wafer 100 is washed (washing treatment 2). Further, after the surface of the wafer 100 is washed by the treatment solution APM for a predetermined time, the flow regulators 52b, 52c, and 52d are closed (S19) and the washing of the surface of the wafer 100 by the treatment solution APM is ended.

After that, the opening degree of the flow regulator 52c is again adjusted whereby pure water ($H_2O$) from the treatment solution tank 51c runs through the individual tube 54c by a flow rate corresponding to the opening degree of the flow regulator 52c and flows into the treatment solution feed pipe 55 (S20). Due to this, pure water ($H_2O$) is continuously fed from the treatment solution feed pipe 55 to the surface of the wafer 100, whereby the surface of the wafer 100 is again washed by the fed pure water ($H_2O$) (washing treatment 3). Further, after the surface of the wafer 100 is washed by the pure water ($H_2O$) for a predetermined time, the flow regulator 51c is closed (S21) and the washing of the surface of the wafer 100 by the pure water ($H_2O$) is ended.

If the washing treatments 1, 2, and 3 end in this way, the treatment solution holding plate 15 rises to the highest point (S22: see FIG. 5), then treatment is continued in accordance with the procedure which is shown in FIG. 3B. That is, the substrate holding plate 10 is rotated by a high speed (for example, 1500 rpm or so). Due to this, the wafer 100 rotates at a high speed together with the substrate holding plate 10 (S23). If the wafer 100 rotates at a high speed in this way, the moisture which remains on the wafer 100 is scattered by the centrifugal force and the moisture on the wafer 100 is removed (drying treatment).

If the drying treatment of the wafer 100 is performed for a predetermined time, the rotation of the substrate holding plate 10 is stopped (S24) and the treated wafer 100 which is held on the substrate holding plate 10 is unloaded (S25). After this, the successively fed wafers 100 are treated in accordance with a similar procedure as explained above (see FIG. 3A and FIG. 3B).

According to the above-explained substrate treatment device, the surface of the wafer 100 which is held on the substrate holding plate 10 holds the treatment solution S in a layer state. This layer state treatment solution S is uniformly heated overall by the treatment solution holding plate 15 which is heated by the circularly shaped heater 20, so the treatment solution S can be more efficiently heated. Further, the surface of the wafer 100 is treated in the state where the heated layer state treatment solution S is constantly held by the surface of the wafer 100, so the treatment solution S is efficiently used without waste to treat the surface of the wafer 100.

Further, the circular hole 20a which is provided at the heater 20 is provided at a position where its center is offset from the axis of rotation C of the substrate holding plate 10 (is off centered). Due to this, the temperature of the treatment solution S which is held in a layer state between the treatment solution holding plate 15 and the surface of the wafer 100 can be made more uniform at the center part near the axis of rotation C and the other parts. That is, if the hole 20a is placed on the axis of rotation, the same location of the wafer 100 (center part) always faces the hole 20a, but if the hole 20a is formed at a position which is off centered with respect to the substrate treatment plate 10 (wafer 100), the part of the wafer 100 which faces the hole 20a successively changes along with rotation of the wafer 100, so the temperature of the treatment solution S can be made uniform.

Figure 9:
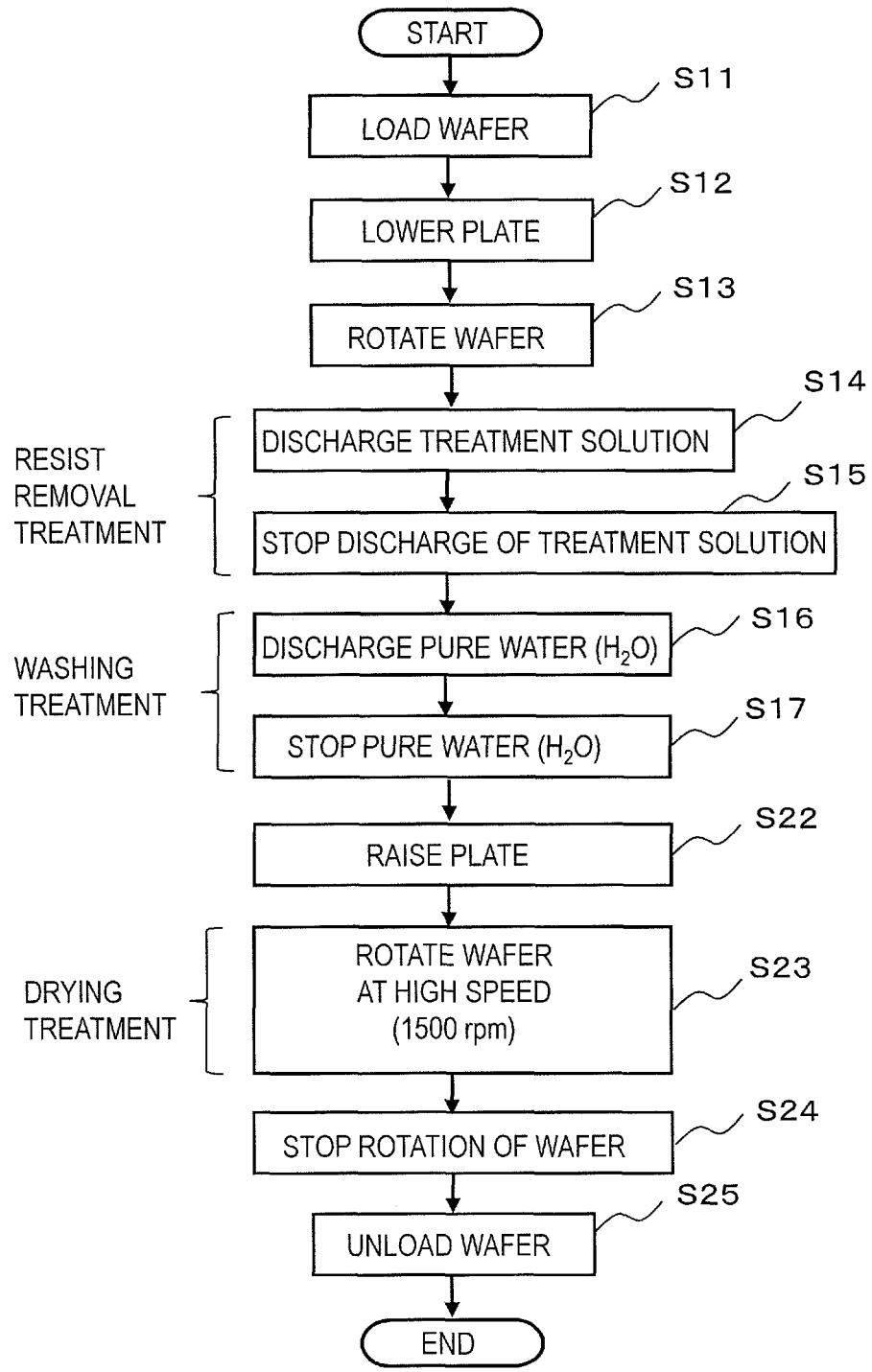
FIG. 9 is a flow chart which shows another example of the operational procedure of the substrate treatment device.

Note that, in the above-mentioned substrate treatment device, after treatment to remove the resist (see FIG. 3A, S14 and S15), washing treatment 1 by pure water (see FIG. 3A, S16 and S17), washing treatment 2 by APM (see FIG. 3A, S18 and S19), furthermore, washing treatment 3 by pure water (see FIG. 3A, S20 and S21), that is, three washing treatments, were performed, but the washing treatment 2 by APM and the washing treatment 3 by pure water can also be omitted. In this case, as shown in FIG. 9, after the resist removal treatment (S14, S15) is ended, the washing treatment by pure water (see S16 and S17) is performed just one time. After this, treatment solution holding plate 15 is raised to the highest position (S22) and drying treatment (S23) is performed for a predetermined time. Further, after this drying treatment ends, rotation of the wafer 100 is stopped (S24) and the wafer 100 is unloaded (S25).

In the above-mentioned resist removal treatment (see FIG. 3 and FIG. 9, S14), in the state with the treatment solution S held between the surface of the wafer 100 and the treatment solution holding plate 15, the treatment solution S is continuously fed through the treatment solution feed pipe 55. In this case, as stated above, the treatment solution S at the surface of the wafer 100 was replaced with new treatment solution S while the layer state is maintained and the treatment solution S with the resist dissolved in it was successively discharged as waste liquor from the outer circumference part of the rotating wafer 100. The treatment of the surface of the wafer 100 (plate-shaped substrate) by the treatment solution S is not limited to this. In the state of the treatment solution S held between the surface of the wafer 100 and the treatment solution holding plate 15, it is possible to stop the feed of the treatment solution S through the treatment solution feed pipe 55. For example, if exceeding the predetermined temperature, when using a treatment solution of characteristics rapidly raising the treatment ability etc., it is preferable to stop the feed of the treatment solution S through the treatment solution feed pipe 55 in the state where the treatment solution S is held between the surface of the wafer 100 and the treatment solution holding plate 15. In this case, if the new feed of the treatment solution S is stopped and the treatment solution S is kept on the surface of the wafer 100 without being replaced and therefore the treatment solution S which is heated during that time exceeds the predetermined temperature, the surface of the wafer 100 is treated by the treatment solution which exceeds the predetermined temperature and has become a relatively high temperature. For example, when using a treatment solution which is constituted by phosphoric acid to etch (remove) the nitride film which is formed on the surface of the wafer 100, it is preferable to adopt such a technique. With this technique, for example, it is possible to stop the feed of the treatment solution S for exactly the time by which it is anticipated the required treatment of the wafer 100 will be completed by the treatment solution S which exceeds the predetermined temperature. Further, it is possible to stop the feed of the treatment solution S in accordance with temperature control which utilizes a thermometer etc.

Figure 10:
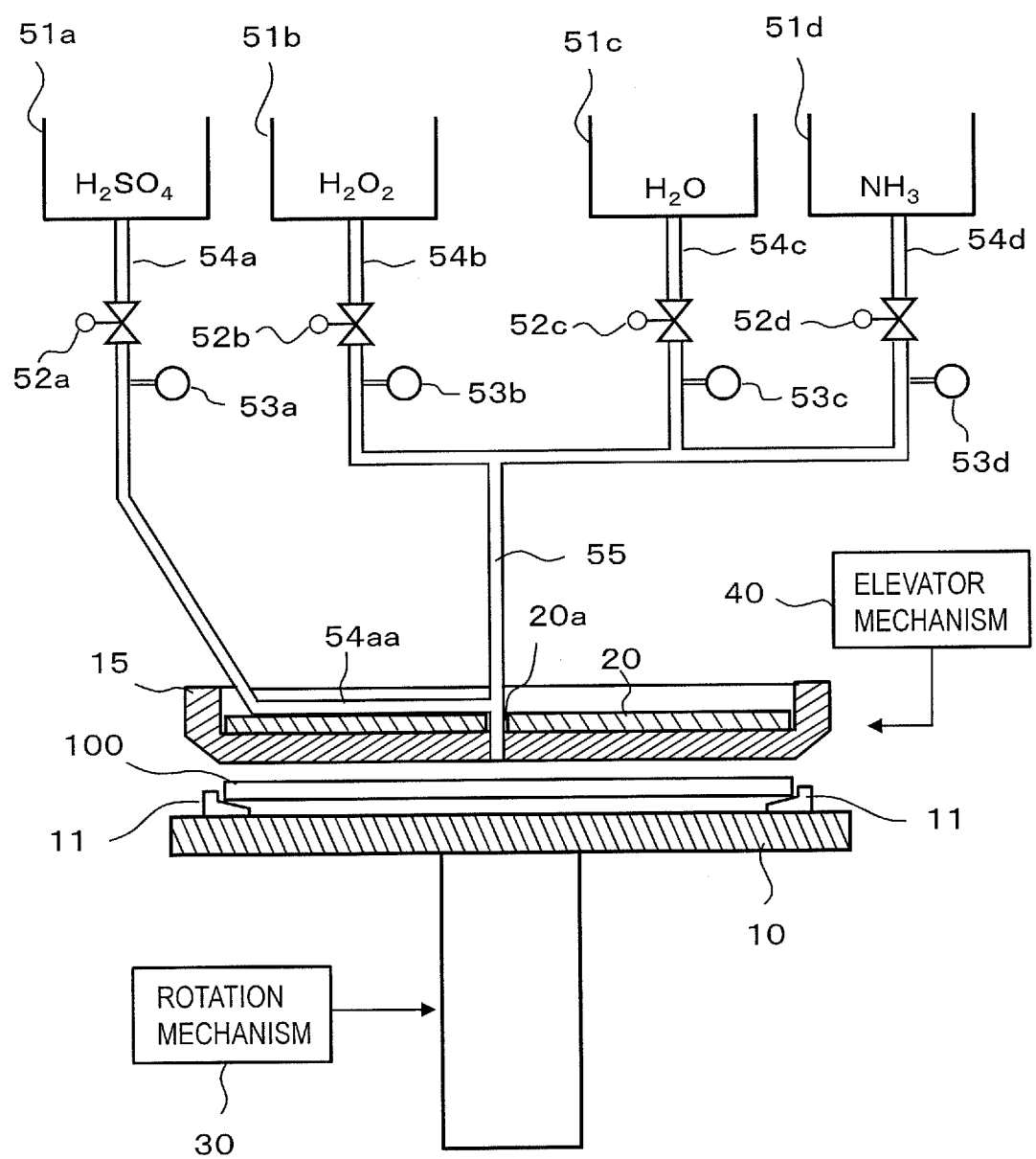
FIG. 10 is a view which shows the configuration of a substrate treatment device according to a second embodiment of the present invention.

The substrate treatment device according to the second embodiment of the present invention is configured as shown in FIG. 10. In this treatment device, the individual tube 54a which extends from the treatment solution tank 51a which stores the sulfuric acid ($H_2SO_4$) has a heating tube part 54aa which is arranged abutting against the circular sheet shaped heater 20 which is provided at the treatment solution holding plate 15. The sulfuric acid ($H_2SO_4$) which flows out from the treatment solution tank 51a and runs through the individual tube 54a is heated by the heater 20 when passing through the heating tube part 54aa and flows into the treatment solution feed pipe 55 in the high temperature state. Note that, the rest of the configuration is the same as the substrate treatment device according to the first embodiment of the present invention which is shown in FIG. 1.

According to such a substrate treatment device, sulfuric acid ($H_2SO_4$) is heated by the heater 20 which is provided at the treatment solution holding plate 15 and in that state is mixed with the hydrogen peroxide solution ($H_2O_2$) inside of the treatment solution feed pipe 55 whereby the treatment solution S is produced, so the relatively high temperature treatment solution S is fed to the clearance between the treatment solution holding plate 15 and the surface of the wafer 100. Further, that relatively high temperature treatment solution S is held in a layer state between the treatment solution holding plate 15 and the surface of the wafer 100 and is heated again by the treatment solution holding plate 15. Therefore, without separately providing another heating means, it is possible to more efficiently heat the treatment solution S.

Modifications of the treatment solution holding plate 15 will be explained next.

Figure 11:
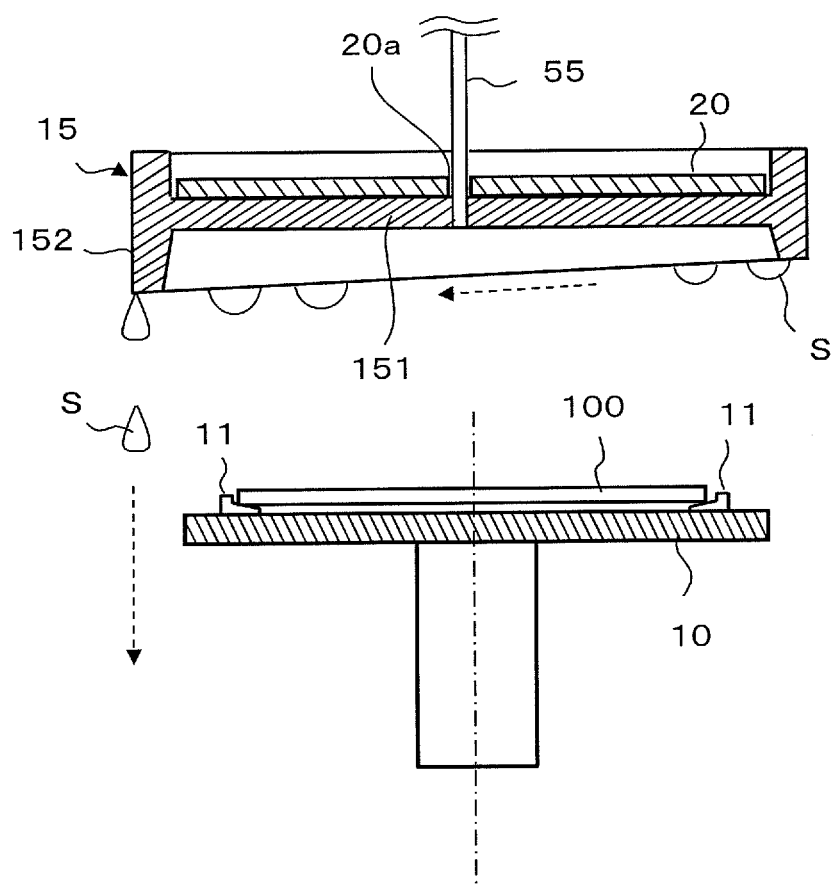
FIG. 11 is a cross-sectional view which shows a first modification of the treatment solution holding plate which is arranged facing the surface of the semiconductor wafer which is held at the substrate holding plate.
Figure 12:
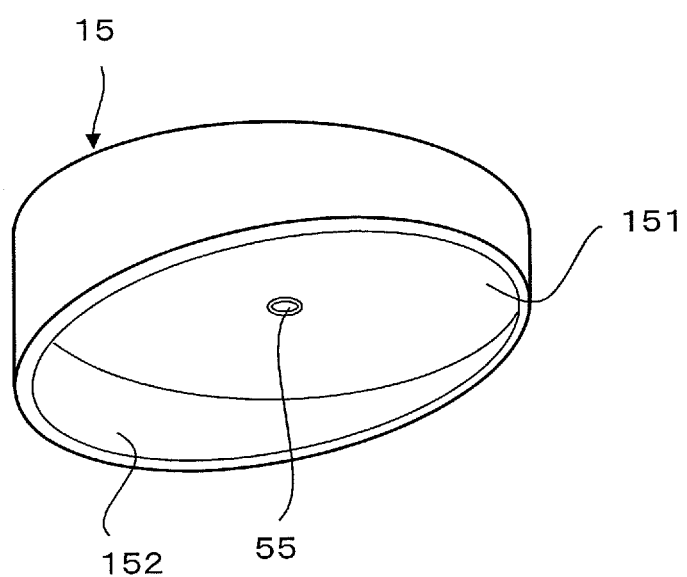
FIG. 12 is a perspective view which shows a first modification of the treatment solution holding plate.

A first modification of the treatment solution holding plate 15 is shown in FIG. 11 and FIG. 12.

In FIG. 11 and FIG. 12, this treatment solution holding plate 15 is structured having a plate body 151 and a wall part 152 which is formed at the rim of the plate body 151 so as to stick out to the substrate holding plate 10 side. The plate body 151 is a circular disk in shape in the same way as the above-mentioned treatment solution holding plate (see FIG. 1 and FIG. 2). A circular sheet-shaped heater 20 is adhered to the surface at the side opposite to the surface which faces the substrate holding plate 10. Further, the treatment solution feed pipe 55 runs through the hole 20a which is formed at the heater 20 and the hole which is formed at the plate body 151 which corresponds to the hole 20a. The surface of the plate body 151 which faces the substrate holding plate 10 becomes a size which is able to cover the surface of the wafer 100 or the surface of the substrate holding plate 10. The rim of the plate body 15 is positioned at the outside of the rim of the wafer 100 and the rim of the substrate holding plate 10.

Further, the wall part 152 which is formed at the rim of the plate body 151 is formed so that the front end slants in a direction cutting across the treatment solution holding plate 15 (left-right direction in FIG. 11). Specifically, the front end slants from the right side toward the left side in FIG. 11 so that the wall part 152 gradually becomes higher.

According to the treatment solution holding plate 15 of this structure, for example, when the above-mentioned washing treatment 3 (see FIG. 3A) or the washing treatment (see FIG. 9) ends or when, due to some reason or another in the process of the treatment to remove the resist, the treatment solution holding plate 15 is raised, the pure water or treatment solution S which deposits at the rim of the treatment solution holding plate 15 where the heating temperature has become relatively low and evaporation is difficult travels along the slanted front end of the wall part 152 and collects at one side of the treatment solution holding plate 15. Further, drops of pure water and the treatment solution S drop down from the rim of the wafer 100 and the rim of the substrate holding plate 10 to the outside. Due to this, it is possible to prevent pure water or the treatment solution S from dropping down on the substrate holding plate 10 or the wafer 100 which is held on the same. Furthermore, in the state where the treatment solution holding plate 15 rises, it is possible to prevent the pure water or treatment solution S which drops down from the treatment solution holding plate 15 from sticking to the robot arm which enters between the treatment solution holding plate 15 and the substrate holding plate 10. That is, by making the treatment solution S or pure water collect at one side of the plate 15 and making the robot arm enter from the direction opposite to the direction at which the treatment solution collects (other side of the plate 15) in the structure, it is possible to prevent the treatment solution from depositing on the robot arm.

Figure 13:
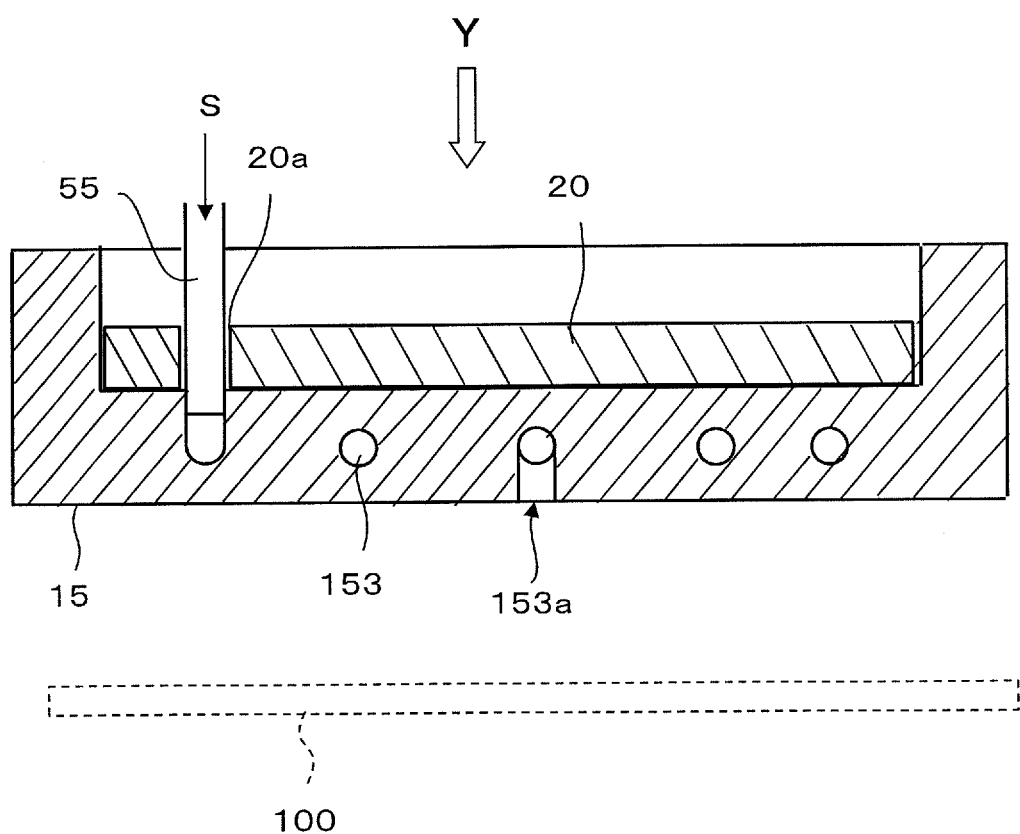
FIG. 13 is a cross-sectional view which shows a second modification of the treatment solution holding plate.
Figure 14:
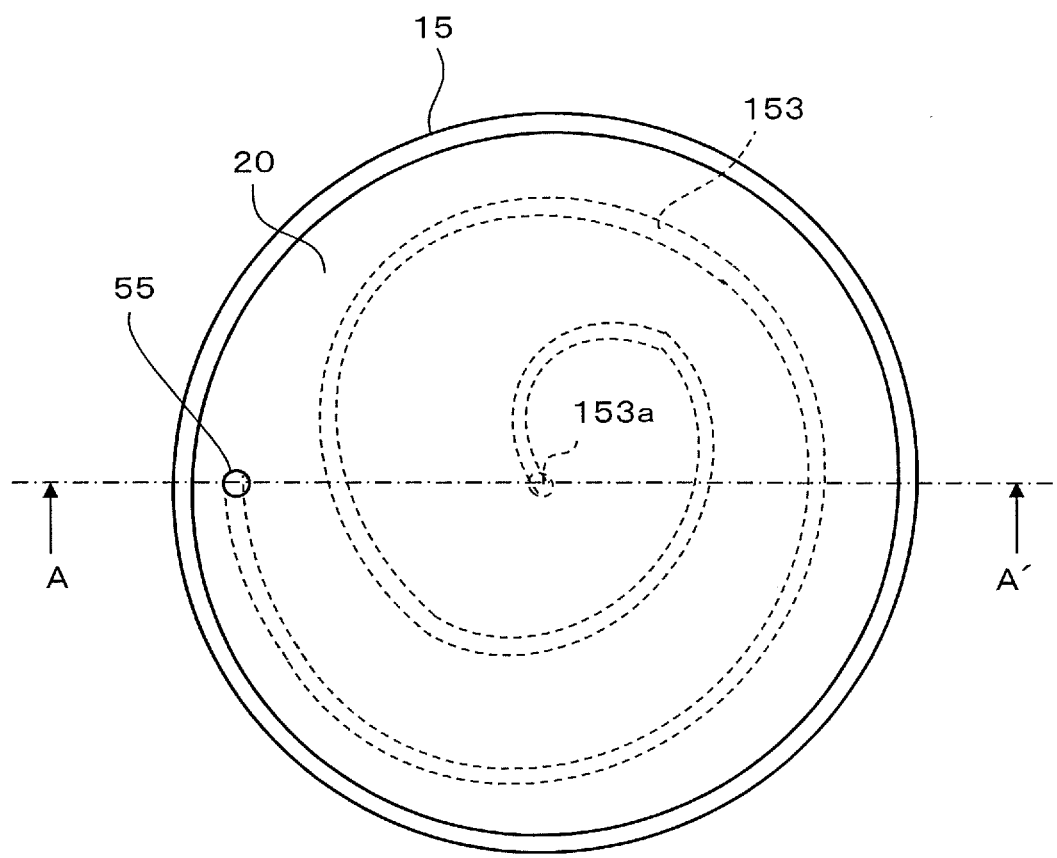
FIG. 14 is a plan view which shows the second modification of the treatment solution holding plate (view seen from arrow Y of FIG. 13).

A second modification of the treatment solution holding plate 15 is shown in FIG. 13 and FIG. 14. Note that, FIG. 13 shows the cross-section along the line A-A' of the treatment solution holding plate 15 which is shown in FIG. 14.

In FIG. 13 and FIG. 14 (view seen along the direction of the arrow Y of FIG. 13), a hole 20a is formed at a predetermined location near the rim of the circular sheet shaped heater 2. The treatment solution feed pipe 55 is inserted through this hole 20a into the treatment solution holding plate 15. The treatment solution holding plate 15 is formed with a channel 153 which extends along the surface which faces the surface of the wafer 10. At the approximately center of the face of the treatment solution holding plate 15 which faces the surface of the wafer 10, an opening 153a is formed. The channel 153 extends from the front end of the treatment solution feed pipe 55 in a spiral shape and reaches the opening 153a.

According to the treatment solution holding plate 15 of such a structure, the treatment solution S which flowed through the treatment solution feed pipe 55 is heated while running through the channel 153 which is formed in a spiral shape inside the treatment solution holding plate 15. The treatment solution S which is thus heated and becomes a relatively high temperature is fed from the opening 153a of the channel 153 to between the surface of the wafer 100 and the treatment solution holding plate 15. For this reason, it is possible to maintain a higher temperature treatment solution S in a layer state between the treatment solution holding plate 15 and the wafer 100.

The circular sheet-shaped heater 20 is not one which generates heat uniformly from the surface as a whole. For example, in the case of a structure where a wire-shaped heating element is arranged in a predetermined shape, the temperature distribution in the plane of the treatment solution holding plate 15 which is heated by the heater 20 corresponds to the laid out shape of the wire-shaped heating element in the heater 20. In such a case, the above-mentioned channel 153 can be formed along a region which is easily heated which is determined in accordance with the temperature distribution in the plane of the treatment solution holding plate 15 (for example, corresponding to the laid out shape of the wire-shaped heating element in the heater 20). In this case, the region which is easily heated in the treatment solution holding plate 15 is cooled by the treatment solution S which flows through the channel 153 (treatment solution S is heated), the temperature distribution in the plane of the treatment solution holding plate 15 which is heated by the heater 20 can become more uniform. As a result, the temperature distribution of the treatment solution S which is maintained in a layer state between the surface of the wafer 100 and the treatment solution holding plate 15 can also become more uniform.

Figure 15:
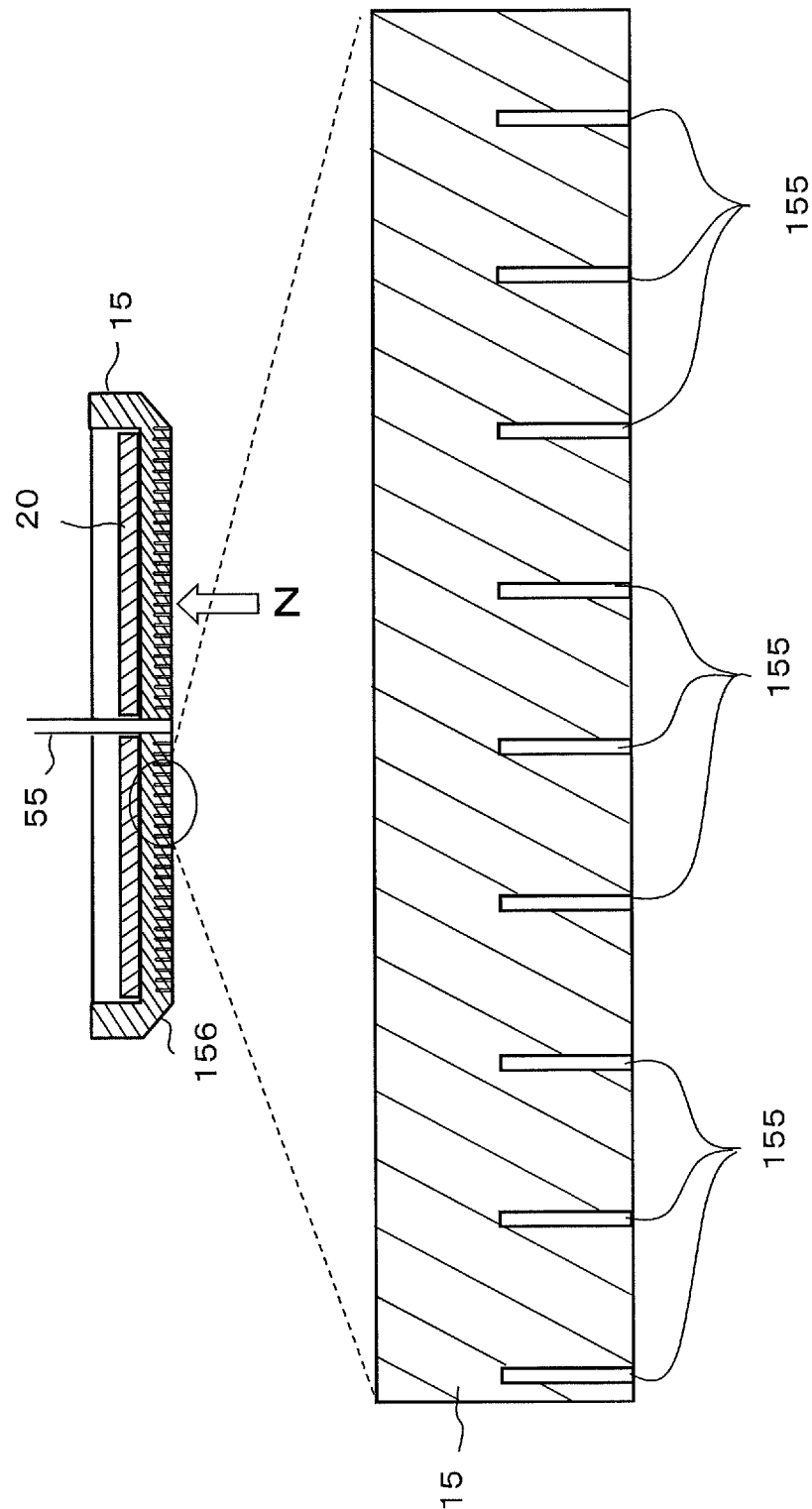
FIG. 15 is an enlarged cross-sectional view which shows a third modification of the treatment solution holding plate.
Figure 16:
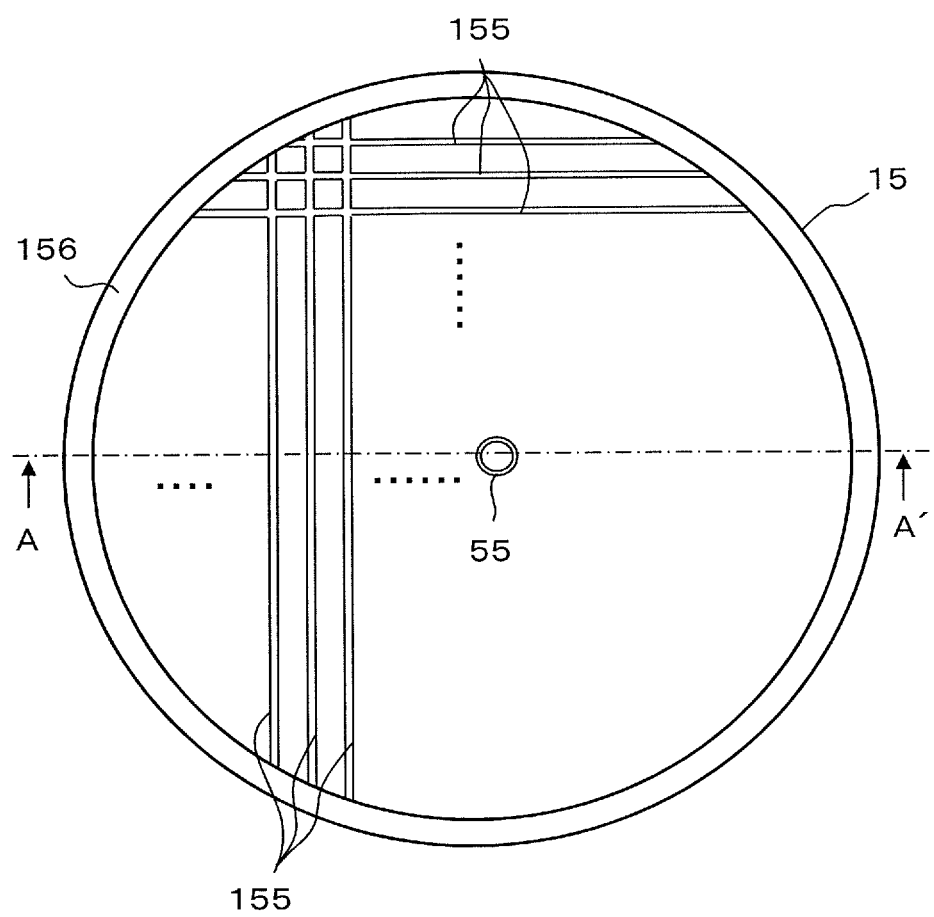
FIG. 16 is a plan view which shows the third modification of the treatment solution holding plate (view seen from arrow Z direction of FIG. 15).

A third modification of the treatment solution holding plate 15 is shown in FIG. 15 and FIG. 16 (views seen from arrow Z-direction of FIG. 15). Note that, FIG. 15 shows a cross-section along the line A-A' of the treatment solution holding plate 15 which is shown in FIG. 16.

In FIG. 15 and FIG. 16, the surface of the treatment solution holding plate 15 which faces the surface of the wafer 100 is formed with a plurality of grooves 155 which open at that surface and lead to the peripheral face 156 of the treatment solution holding plate 15. These plurality of grooves 155, as shown in FIG. 16, are arranged in a vertical and horizontal lattice at this surface of the treatment solution holding plate 15.

According to the treatment solution holding plate 15 of this structure, even if the treatment solution S which contacts the surface of the treatment solution holding plate 15, which is heated by the circular sheet-shaped heater 20, which faces the surface of the wafer 100 vaporizes and a gas is produced, it becomes possible not to form a layer of gas between the treatment solution S and the surface of the treatment solution holding plate 15 but to have the gas run through the grooves 155 and escape to the outside of the treatment solution holding plate 15. For this reason, it becomes possible to efficiently heat the treatment solution S without insulation by the gas.

The above-mentioned plurality of grooves 155, as shown in FIG. 16, were arranged in a lattice, but the type of the array is not particularly limited if the grooves 155 lead to the peripheral face 156 of the treatment solution holding plate 15 and, for example, may be arranged radially.

Figure 17:
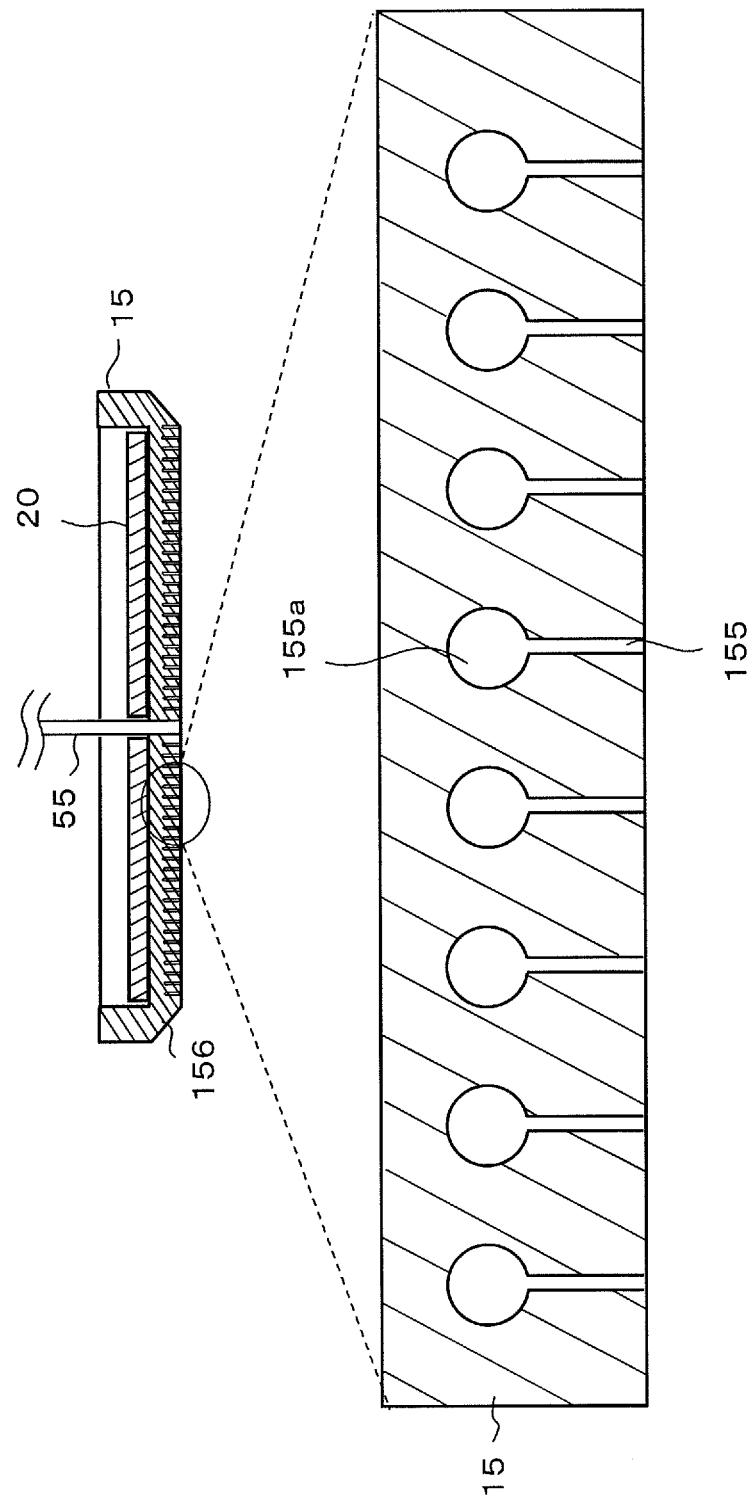
FIG. 17 is an enlarged cross-sectional view which shows a fourth modification of the treatment solution holding plate.

A fourth modification of the treatment solution holding plate 15 is shown in FIG. 17.

In FIG. 17, in the same way as the above-mentioned third modification (see FIG. 15 and FIG. 16), the surface of the treatment solution holding plate 15 which faces the surface of the wafer 100 is formed with lattice of a plurality of grooves 155 which open at the surface and lead to the peripheral side face 156 of the treatment solution holding plate 15. Furthermore, the bottom parts of the grooves 155 are formed with cylindrically shaped passages 155a of widths broader than the groove widths. According to this, the gas obtained by the treatment solution S which is heated evaporating and being led to the grooves 155 can pass through the cylindrical passages 155a and reliably escape to the outside of the treatment solution holding plate 15.

Figure 18:
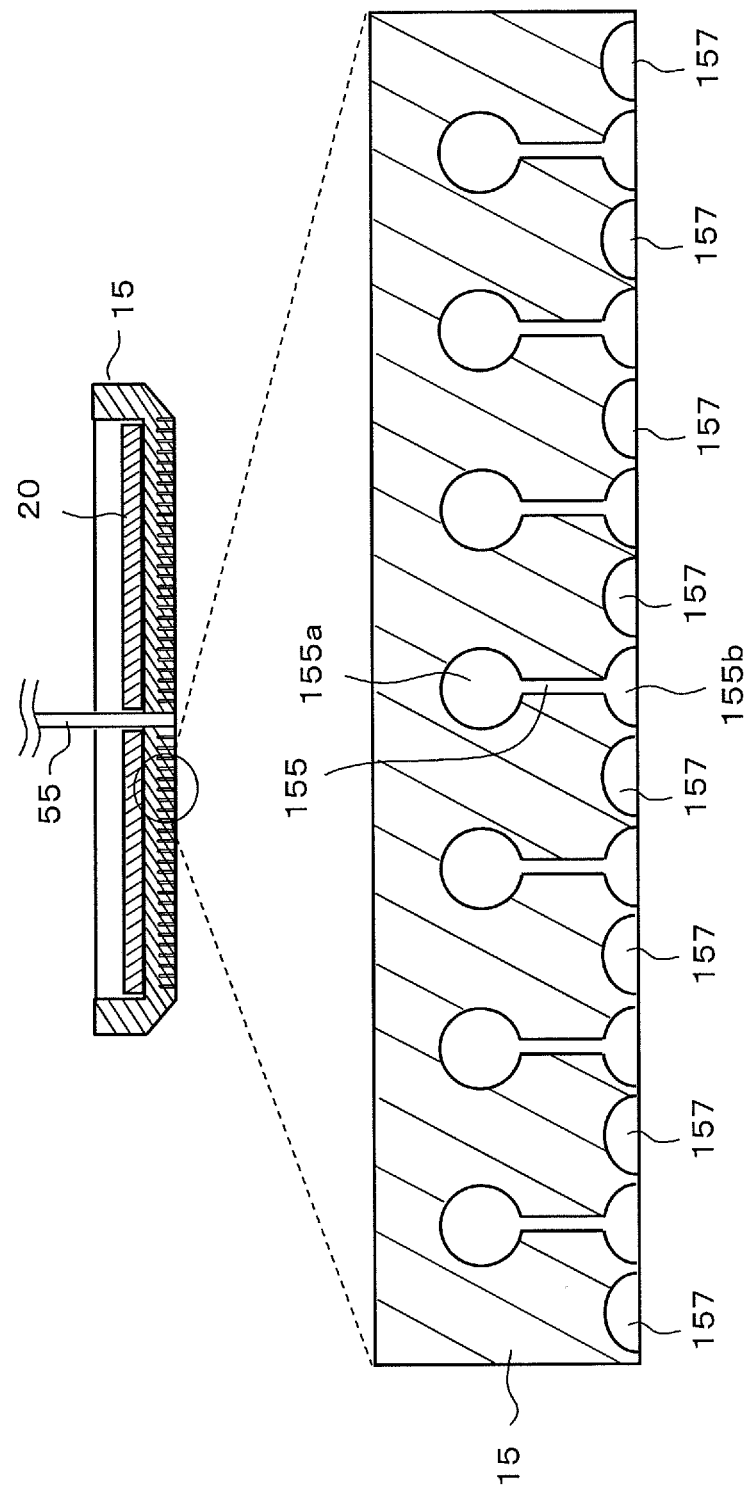
FIG. 18 is an enlarged cross-sectional view which shows a fifth modification of the treatment solution holding plate.

A fifth modification of the treatment solution holding plate 15 is shown in FIG. 18.

In FIG. 18, in the same way as the above-mentioned fourth modification (see FIG. 17), the surface of the treatment solution holding plate 15 which faces the surface of the wafer 100 is formed with cylindrical passages 155a at the bottom surfaces of the grooves 155 which open at the surface and lead to the peripheral side face 156 of the treatment solution holding plate 15. Furthermore, the opening parts of the grooves 155 at the surface of the treatment solution holding plate 15 are formed as semicylindrical recesses 155b of widths broader than the groove widths. According to this, even if the treatment solution S which contacts the surface of the treatment solution holding plate 15, which is heated by the heater 20, which faces the surface of the wafer 100 vaporizes and a gas is generated, the gas can be collected by the semicylindrical recesses 155b and effectively be guided to the insides of the grooves 155. Further, it is possible to run the gas which was guided to the grooves 155 through the cylindrical passages 155a to reliably release it to the outside of the treatment solution holding plate 15. Further, due to the semicylindrical recesses 155b which are formed as open parts of the grooves 155, the surface of the treatment solution holding plate 15 which faces the surface of the wafer 100 becomes larger in surface area, so it is possible to more efficiently heat the treatment solution S which contacts that surface.

Furthermore, the surface of the treatment solution holding plate 15 where the grooves 155 are formed (surface which faces the surface of the wafer 100) is formed with a plurality of recesses 157. The recesses 157 may be spherical shaped (dimple shaped) ones, groove shaped ones, or further other shaped ones. When the surface of the treatment solution holding plate 15 which is formed with grooves 155 in this way is formed with a plurality of recesses 157 in this way, the surface area of the surface of the treatment solution holding plate 15 which faces the wafer 100 becomes further larger, so it becomes possible to more efficiently heat the treatment solution S which contacts that surface of the treatment solution holding plate 15.

Figure 19:
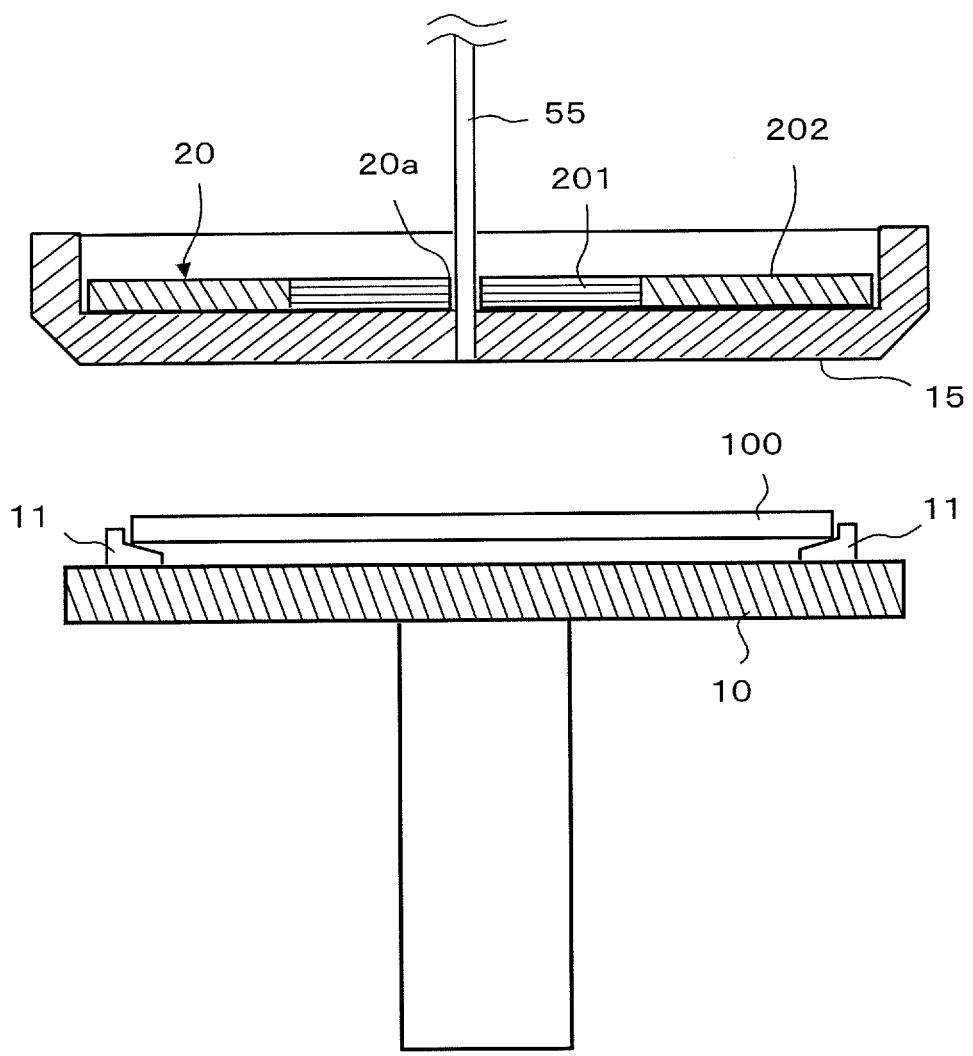
FIG. 19 is a cross-sectional view which shows a modification of a sheet-shaped heater which is provided at the surface of the treatment solution holding plate at the opposite side from the surface which faces the surface of the semiconductor wafer which is held by the substrate holding plate.

Next, a modification of the circular sheet-shaped heater 20 is shown in FIG. 19.

In FIG. 19, the circular sheet-shaped heater 20 which is adhered to the surface of the treatment solution holding plate 15 at the opposite side to the surface which faces the surface of the wafer 100 is comprised of two heater pieces 201, 202 which enable individual control of the amounts of heat generation. The ring-shaped heater piece 202 is arranged concentrically at the outside of the circular heater piece 201. According to this heater 20, by individually controlling the amounts of heat generation of the two concentrically arranged heater pieces 201, 202, it becomes possible to use a treatment solution S which partially differs in temperature, specifically a treatment solution S which differs in temperature for each concentric part, so as to treat the surface of the wafer 100. For example, when the center part of the wafer 100 is coated with a large amount of resist, by controlling the amount of heat generation of the circular heater piece 201 which is positioned at the inside to become larger than the amount of heat generation of the outside ring-shaped heater 202, it becomes possible to effectively remove the resist which deposits on the surface of the wafer 100.

The substrate treatment device according to the above embodiments of the present invention was one which performed treatment for removal of resist from the surface of a wafer 100, but it is also possible to treat a liquid crystal substrate or other plate-shaped substrate. Further, the treatment solution holding plate 15 was provided with a treatment solution heating mechanism constituted by a sheet-shaped heater, but the invention is not limited to a sheet shape if possible to heat the treatment solution holding plate 15. For example, it is also possible to use a plate-shaped member in which a wire-shaped heater is embedded. Furthermore, when selecting a wafer as an object for treatment, the heater is preferably circular, but the shape may be suitably changed and set in accordance with the treated object.

REFERENCE SIGNS LIST

10 substrate holding plate (substrate holding part)
15 treatment solution holding plate
20 heater (heating part)
20a hole
30 rotation mechanism
40 elevator mechanism
50 treatment solution feed mechanism
51a, 51b, 51c, 51d treatment solution tank
52a, 52b, 52c, 52d valve
53a, 53b, 53c, 53d flowmeter
54a, 54b, 54c, 54d individual tubes
55 treatment solution feed pipe
100 semiconductor wafer (plate-shaped substrate)
151 plate body
152 wall part
153 channel
153a opening
155 groove
155a cylindrical passage
155b semicylindrical recess
156 peripheral side surface
157 recess
201, 202 heater piece

The invention claimed is:

1. A substrate treatment device which is provided with a treatment solution feed mechanism that feeds a treatment solution to a surface of a plate-shaped substrate that is held on a substrate holding part which is rotated about a predetermined axis of rotation and which uses the treatment solution to treat the surface of said plate-shaped substrate, said substrate treatment device comprising:

a treatment solution holding plate which is arranged facing the surface of said plate-shaped substrate that is held on said substrate holding part, across a predetermined distance, so as to hold the treatment solution between the surface of said plate-shaped substrate and it; and a heating part which is in contact with a predetermined region of said treatment solution holding plate, including a position corresponding to the axis of rotation of said substrate holding part, to heat the predetermined region, wherein said treatment solution feed mechanism feeds the treatment solution to a clearance between the surface of said plate-shaped substrate which rotates together with the substrate holding part and the treatment solution holding plate which is heated by said heating part.

2. The substrate treatment device as set forth in claim 1, wherein said treatment solution feed mechanism feeds the treatment solution through a part of said treatment solution holding plate which does not contact said heating part to the clearance between the surface of said plate-shaped substrate and said treatment solution holding plate.

3. The substrate treatment device as set forth in claim 1,
wherein said heating part has a sheet-shaped heater which is provided so as to be in contact with a surface of said treatment solution holding plate, said surface being at an opposite side of a surface facing said plate-shaped substrate, wherein said sheet-shaped heater is formed with a hole at a position offset from said axis of rotation of said substrate holding part, and wherein said treatment solution feed mechanism feeds the treatment solution through said hole of said sheet-shaped heater to the clearance between the surface of said plate-shaped substrate and said treatment solution holding plate.

4. The substrate treatment device as set forth in claim 1, wherein said treatment solution feed mechanism feeds the treatment solution through a position of said treatment solution holding plate offset from said axis of rotation of said substrate holding part to the clearance between the surface of said plate-shaped substrate and said treatment solution holding plate.

5. The substrate treatment device as set forth in claim 1, wherein said treatment solution holding plate has a plate body which can cover the surface of said plate-shaped substrate and a wall part which is formed at a rim of said plate body so as to project to a side of said substrate holding part, and
    a front end of said wall part slants in a direction across said treatment solution holding plate.

6. The substrate treatment device as set forth in claim 1, wherein inside said treatment solution holding plate, a channel is formed which extends along the surface of the treatment solution holding plate which faces the surface of said plate-shaped substrate and opens at a predetermined position of the surface, and
    the treatment solution from said treatment solution feed mechanism is fed through said channel to the clearance between the treatment solution holding plate and the surface of the plate-shaped substrate.

7. The substrate treatment device as set forth in claim 6, wherein said channel is formed in a spiral shape inside said treatment solution holding plate.

8. The substrate treatment device as set forth in claim 6, wherein said channel is formed along an easily heated region which is determined in accordance with a temperature distribution in a plane of said treatment solution holding plate caused by heating of said heating part.

9. The substrate treatment device as set forth in claim 1, wherein said heating part is formed by a plurality of individual heating parts which enable individual control of the amounts of generation of heat.

10. The substrate treatment device as set forth in claim 3, wherein said sheet-shaped heater has a plurality of heater parts which are arranged concentrically at the surface of said treatment solution holding plate at the opposite side from the surface which faces said plate-shaped substrate and enable individual control of the amounts of generation of heat.

11. The substrate treatment device as set forth in claim 1, wherein the surface of said treatment solution holding plate which faces said plate-shaped substrate is formed with a plurality of grooves which open at the surface and lead to a side face of said treatment solution holding plate.

12. The substrate treatment device as set forth in claim 11, wherein a bottom part of at least one of said plurality of grooves is formed with a passage of a width which is broader than the groove width.

13. The substrate treatment device as set forth in claim 11, wherein an opening part of at least one of the plurality of grooves at the surface of said treatment solution holding plate which faces said plate-shaped substrate is formed as a recess of a width broader than a groove width.

14. The substrate treatment device as set forth in claim 11, wherein the surface of said treatment solution holding plate which faces said plate-shaped substrate is formed with a plurality of recesses of widths broader than groove widths.

15. The substrate treatment device as set forth in claim 11, wherein said treatment solution feed mechanism has a channel through which all or part of said treatment solution flows and is heated by heat from a heating part which heats said treatment solution holding plate.

16. A substrate treatment method using said substrate treatment device as set forth in claim 1, said substrate treatment method comprising:
    a treatment solution feeding step which feeds the treatment solution from said treatment solution feed mechanism to the clearance between the surface of said plate-shaped substrate which rotates together with said substrate holding part and said treatment solution holding plate, and
    a treatment solution holding step which holds the treatment solution at the clearance between the surface of said plate-shaped substrate and said treatment solution holding plate which is heated by said heating part.

17. The substrate treatment method as set forth in claim 16, wherein said treatment solution holding step feeds the treatment solution from said treatment solution feed mechanism continuously.

18. The substrate treatment method as set forth in claim 16, wherein said treatment solution holding step feeds said treatment solution from said treatment solution feed mechanism not continuously.

* * * * *